(12) United States Patent
Matsuda et al.

(10) Patent No.: US 6,547,461 B1
(45) Date of Patent: Apr. 15, 2003

(54) PHOTOSENSITIVE MATERIAL AUTOMATIC-PROCESSING APPARATUS

(75) Inventors: Shinichi Matsuda, Kanagawa (JP); Kenji Inoue, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 260 days.

(21) Appl. No.: 09/597,422

(22) Filed: Jun. 19, 2000

(30) Foreign Application Priority Data

Jun. 18, 1999 (JP) .......................................... 11-172525
Aug. 30, 1999 (JP) .......................................... 11-243611

(51) Int. Cl.⁷ ................................................. G03D 3/08
(52) U.S. Cl. ........................ 396/614; 396/617; 492/30; 492/35
(58) Field of Search ................................. 396/604, 606, 396/614, 627, 617; 492/30, 35; 118/110, 114, 116–119

(56) References Cited

U.S. PATENT DOCUMENTS 3,916,426 A * 10/1975 Bown ........................ 396/614
5,329,331 A * 7/1994 Hatori et al. ............... 396/627

FOREIGN PATENT DOCUMENTS

| JP | 8-234444 | 9/1996 | ............ G03F/7/30 |
| JP | 11-95446 | * 4/1999 | |

OTHER PUBLICATIONS

Patent Abstracts of Japan 08234444 Sep. 13, 1996.

* cited by examiner

Primary Examiner—D. Rutledge
(74) Attorney, Agent, or Firm—Sughrue Mion, PLLC

(57) ABSTRACT

In a photosensitive material processing apparatus of the present invention, a brush roller used in a pre-water-washing section and a developing section is formed by winding a slender band wherein bristles are woven into a knitted fabric onto the peripheral surface of a roller which is a core member. This makes it possible to arrange the bristles closely and uniformly on the whole of the peripheral surface of the roller. Therefore, the brush roller can be applied to a photopolymer plate, which uses a non-polymerizable layer as a photosensitive layer and requires strong rubbing without causing brushing unevenness.

29 Claims, 14 Drawing Sheets

F I G. 5
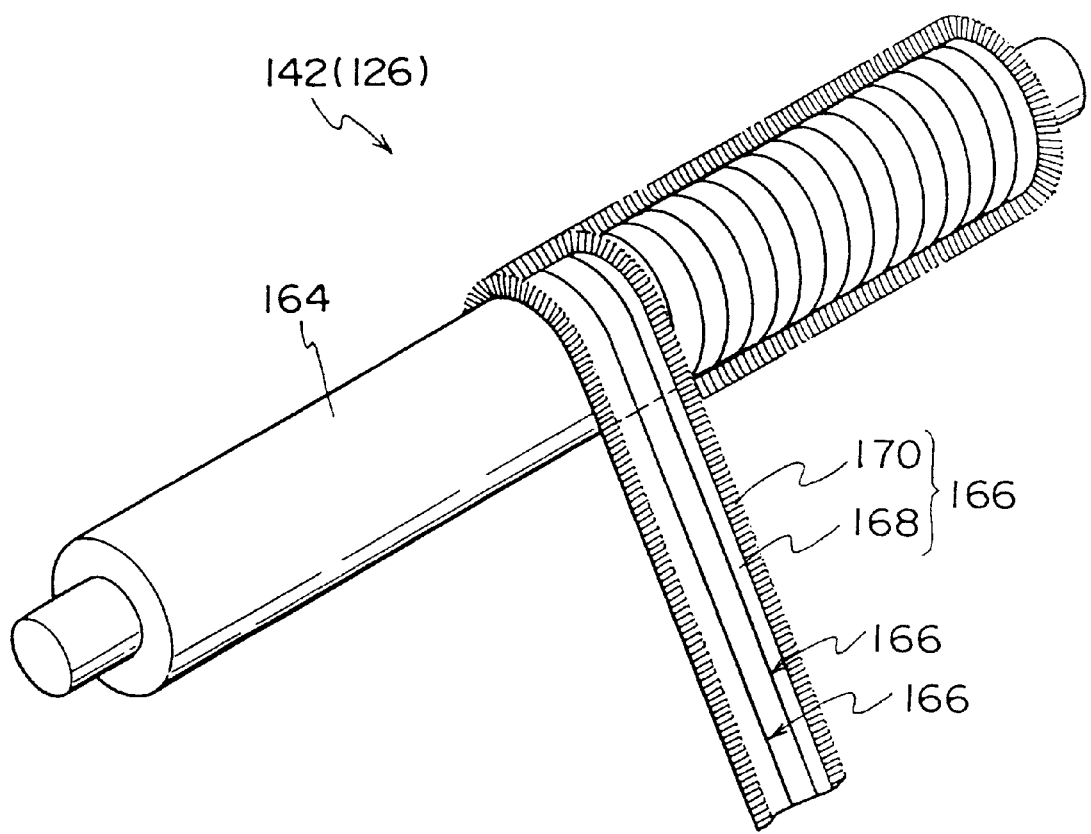

F I G. 6
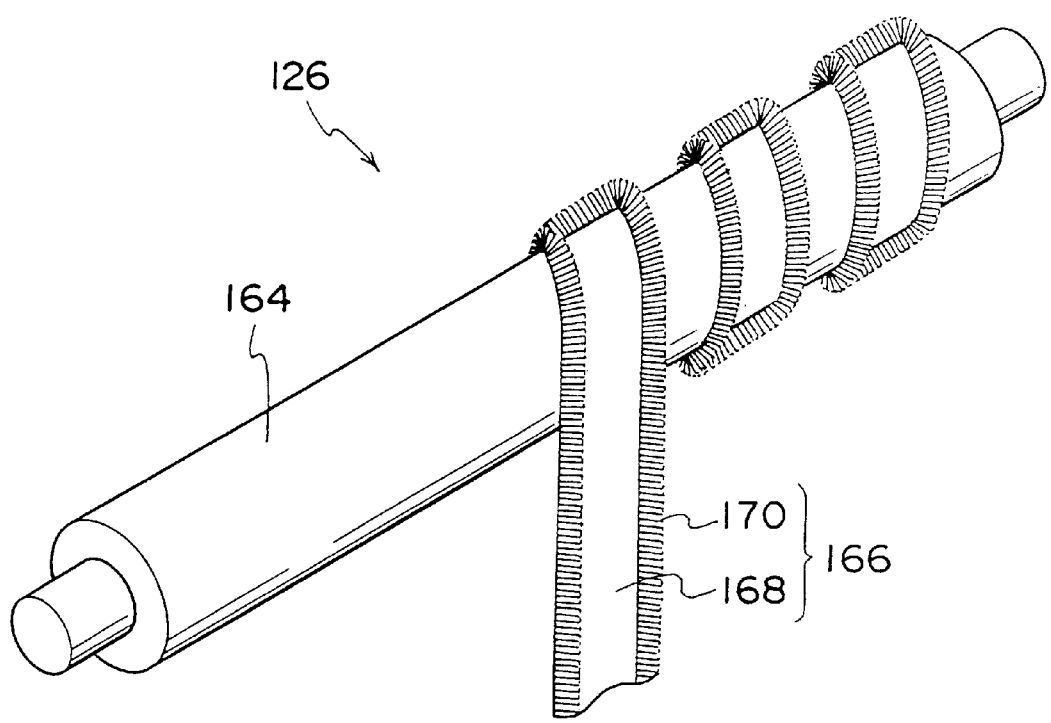

F I G. 1 4
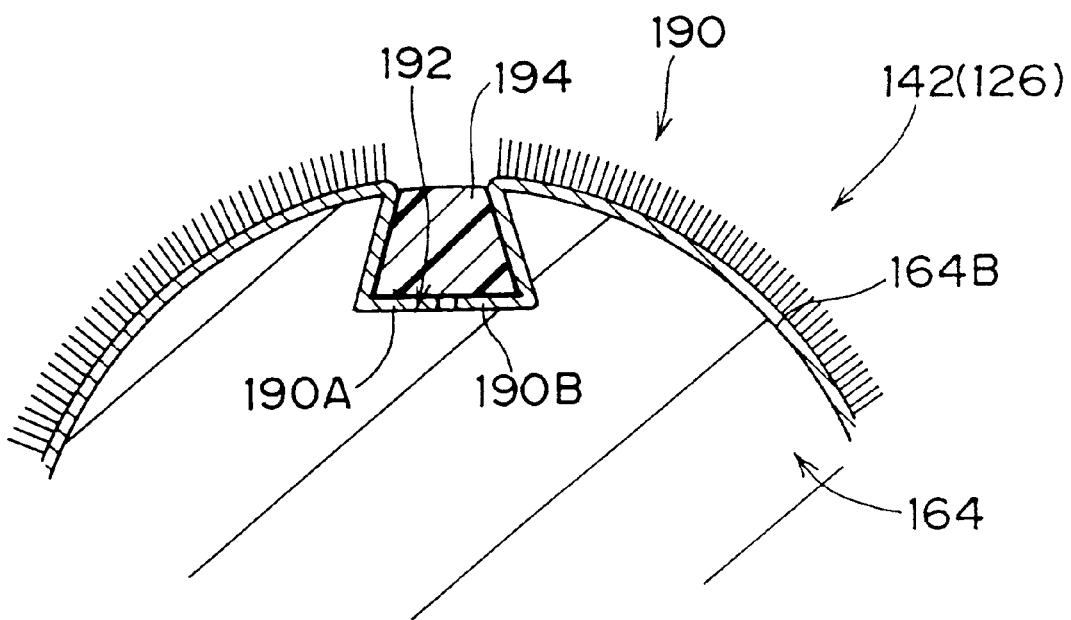

PHOTOSENSITIVE MATERIAL AUTOMATIC-PROCESSING APPARATUS

BACKGROUND OF THE INVENTION

1. Field of the Invention

The present invention relates to a photosensitive material automatic-processing apparatus in which at the time of processing a photosensitive material having a photosensitive layer, such as a photosensitive planographic printing plate, with a processing solution while conveying the photosensitive material, the photosensitive layer is brushed by a brushing member to promote the processing.

2. Prior Art

In a photosensitive planographic printing plate, images are formed when a photosensitive layer superposed on an aluminum plate, which is a support for the photosensitive planographic printing plate, is exposed to light so as to generate exposed portions and unexposed portions, and subsequently processing with a developer is performed to remove the unnecessary portions of the photosensitive layer.

During the processing with the developer, the photosensitive layer is brushed with a brush roller while the photosensitive planographic printing plate is immersed in the developer, so as to remove the unnecessary portions of the photosensitive layer. In this way, clear images can be formed.

In the prior art, a channel brush roller or a molton roller is used as the brush roller.

The channel brush roller can be made by planting bristles into a channel having a substantially "U"-shaped section and then winding this channel in a spiral configuration, tightly around the peripheral portion of a roller. The channel brush roller has excellent durability. However, the interval between the bristles in the spirally-wound channel is large in the axial direction of the brush roller, and thus brushing unevenness in the form of lines may be caused on the surface of the photosensitive planographic printing plate subjected to the brushing process. A complicated mechanism such as a mechanism for rotating the channel brush while the brush itself is being moved back and forth in the axial direction is therefore necessary.

In the channel brush roller, it is difficult to plant the bristles with uniform density and at a uniform angle. Moreover, when the channel is wound and configured as a roller, the bristles have to be made long to a certain extent in order to compensate for gaps between the wound channel portions adjacent to each other. As a result, the bristles cannot be made short and thus the bristles cannot be made firm. If the bristles are made thick so as to increase their firmness, the result is an unsatisfactory brush roller which easily generates brushing unevenness.

In the molton roller, the peripheral surface of the molton roller itself has a brushing function. Thus, brushing unevenness is somewhat better with the molton roller than with the channel brush roller. However, a completely satisfactory state cannot be attained. Besides, the molton roller has drawbacks in that it is not durable and its life span is short.

When pressure is applied to a part of the peripheral surface of the molton roller, that part deforms to generate a difference in the pressure with which the surface of a printing plate is rubbed. This causes brushing unevenness. Further, the material that is usually used in the molton roller wears quickly.

In the case of using, in particular, a photo-polymerizable layer (e.g., a photo-polymerizable layer of a photopolymer plate, which is one type of photosensitive planographic printing plate) as a photosensitive layer, it is necessary to rub the layer. Therefore, when the channel brush roller or the molton roller in the prior art is used, the above-mentioned inconvenience becomes very obvious. When the bristles of the brush roller are strongly applied to the photopolymerizable layer of the photopolymer plate to rub the photopolymer layer strongly, the tips of the bristles bend so that the unnecessary portions of the photopolymer layer cannot be satisfactorily removed. In other words, the original function of the brush roller cannot be attained.

Thus, as a means for overcoming the above-mentioned problems of the channel brush roller, Japanese Patent Application Laid-Open (JP-A) No. 3-96955 discloses a helical channel brush roller that is a modification of the above-mentioned channel brush roller. However, in the helical channel brush roller, the interval between channels cannot be made shorter. It is therefore necessary to perform the brushing process with a considerably increased rotation frequency. If the rotation frequency is increased, a burden is imposed on a bearing which supports the helical channel brush roller. As a result, the bearing wears away with the passage of time and this may cause uneven rotation. Further, this modification cannot overcome the unevenness of the density with which the bristles are planted into a channel.

As a means for overcoming the above-mentioned problems of the molton roller, Japanese Patent Application Laid-Open (JP-A) No. 10-48840 discloses bristles of the molton roller that are made of polypropylene. By this improvement, durability is made greater than molton rollers in the prior art but the drawback of brushing unevenness has not been overcome.

SUMMARY OF THE INVENTION

In the light of the above-mentioned situation, an object of the present invention is to provide a photosensitive material automatic-processing apparatus in which a roller can be used as a core member and the planting density of brushing-bristles that are provided on the peripheral surface of the roller can be made uniform, thereby overcoming brushing unevenness.

A first aspect of the present invention proposes an apparatus for processing photosensitive material, in which the photosensitive material is brushed by a brush member for promoting image; forming processing when it is transported through the apparatus, the brush comprising:

(a) a roller adapted for mounting in the apparatus so as to be rotatable about an axis generally transverse to a direction in which the photosensitive material is transported when being processed in the apparatus, the roller having a peripheral surface; and (b) a brushing band having a substrate with bristles woven into the substrate, the brushing band being set into the peripheral surface of the roller.

According to the first aspect, the bristles for brushing can be made fine. Also, because the bristles are woven, it is possible for the bristles to be disposed at a pitch accurate to the $\mu$m and at a set uniform density. Moreover, since the bristles have an appropriate rigidity, the brushing member can be applied to a photosensitive material that requires relatively strong rubbing.

In a second aspect of the present invention, the substrate apparatus is a knitted fabric.

In a third aspect of the present invention, the bristles comprise at least one material selected from the group consisting of natural fibers and artificial fibers, with each bristle having a thickness from 1 to 10,000 deniers, and a length from 1 to 35 mm, with the bristles arranged in the brushing band to have a density from 1000 to 225,000 deniers per square cm (preferably from 45,000 to 200,000 deniers per square cm) where the density is defined as average number of bristles per unit area multiplied by average thickness of the bristles.

In a fourth aspect of the present invention, a relationship exists between an average length, L, of the bristles in mm and average thickness, D, of the bristles in deniers, with $1 \leq L \leq 7.5 \times [\log(D) + \frac{2}{3}]$.

In a fifth aspect of the present invention, the bristles comprise a metallic fiber, each metallic fiber having a diameter from 10 to 200 $\mu$m and a length from 1 to 30 mm, with the bristles arranged in the brushing band to have a density from 0.05 to 7.0 mm$^2$/cm$^2$, where the density is defined as average number of bristles per cm$^2$ multiplied by average cross sectional area of a bristle in mm$^2$.

In a sixth aspect of the present invention, a relationship exists between an average length, L of the fibers in mm and average diameter of the fibers, R, in $\mu$m, said relationship satisfies $1 \leq L \leq [(0.1R) + 10]$.

In a seventh aspect of the present invention, the roller includes a groove defined in the peripheral surface of the roller for at least partially accommodating the brushing band therein, and a fixing member for fixing the brushing band in the groove.

According to the seventh aspect, the brushing band is at least partially fixed to the groove formed on the outer peripheral portion of the roller by means of the fixing member that is accommodated, together with the brushing band, in the groove. That is, the brushing band can be fixed to the outer peripheral portion of the roller without use of any adhesive agent.

Therefore, a problem where an adhesive agent permeates the bristles from the end of the brushing band and solidifies to cause the bristles to lose flexibility and thus damage a printing plate does not arise. Even if no adhesive agent is used at the time of setting the brushing band onto the outer peripheral portion of the roller, the winding of the band does not become loose and the band can be kept stably set onto the roller. Besides, since no adhesive agent is used, the complicated work of applying of an adhesive agent is not necessary and the brush member can be produced at a low cost.

In an eighth aspect of the present invention, the groove spirally extends along the peripheral surface of the roller.

In a ninth aspect of the present invention, the groove extends substantially parallel to the rotational axis of the roller when the roller is rotatably mounted in the apparatus.

In a tenth aspect of the present invention, the fixing member is a metallic wire.

In an eleventh aspect of the present invention, the fixing member is a resin piece or a metallic piece.

BRIEF DESCRIPTION OF THE DRAWINGS

FIG. 5 is a perspective view of a brush roller formed as three strips wound together in the first embodiment of the present invention.

FIG. 6 is a perspective view of a pitch-wound brush roller based on the first embodiment of the present invention.

FIG. 14 is a sectional view taken on line 9—9 of FIG. 13.

DESCRIPTION OF THE PREFERRED EMBODIMENTS

Figure 1:
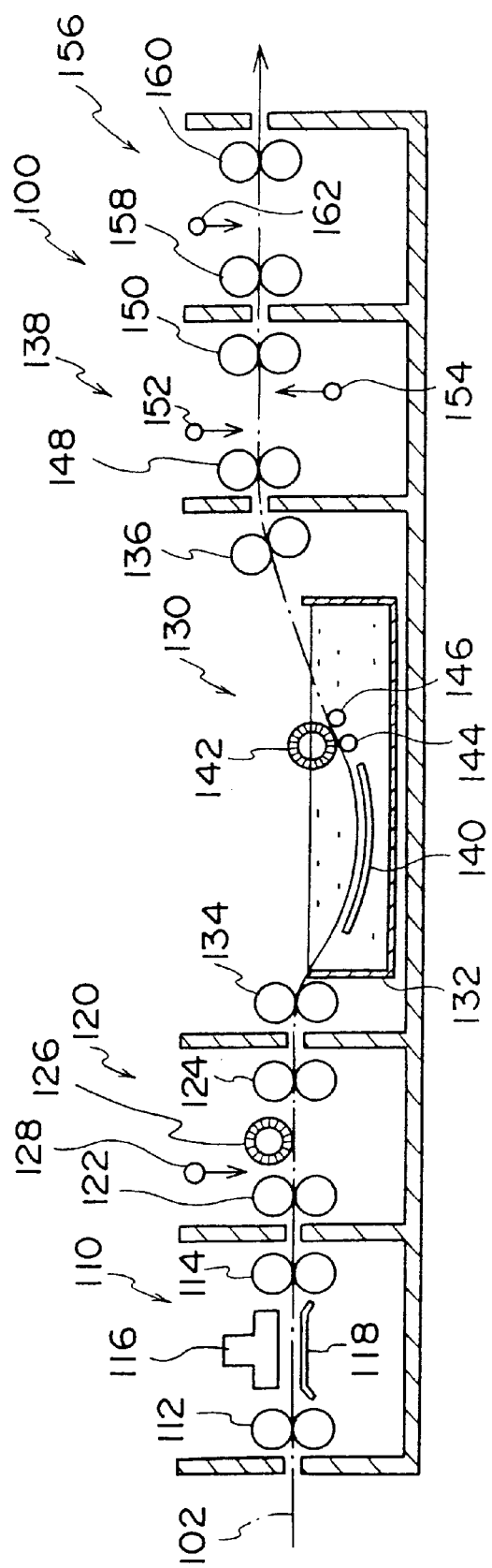
FIG. 1 is a schematic view of an automatic-processing apparatus according to each embodiment of the present invention of the present invention.

FIG. 1 is a schematic view of a photosensitive material automatic-processing apparatus 100 according to a first embodiment of the present invention. In the present embodiment and other embodiments that will be described later, a photosensitive planographic printing plate is used as an example of a photosensitive material.

Figure 2:
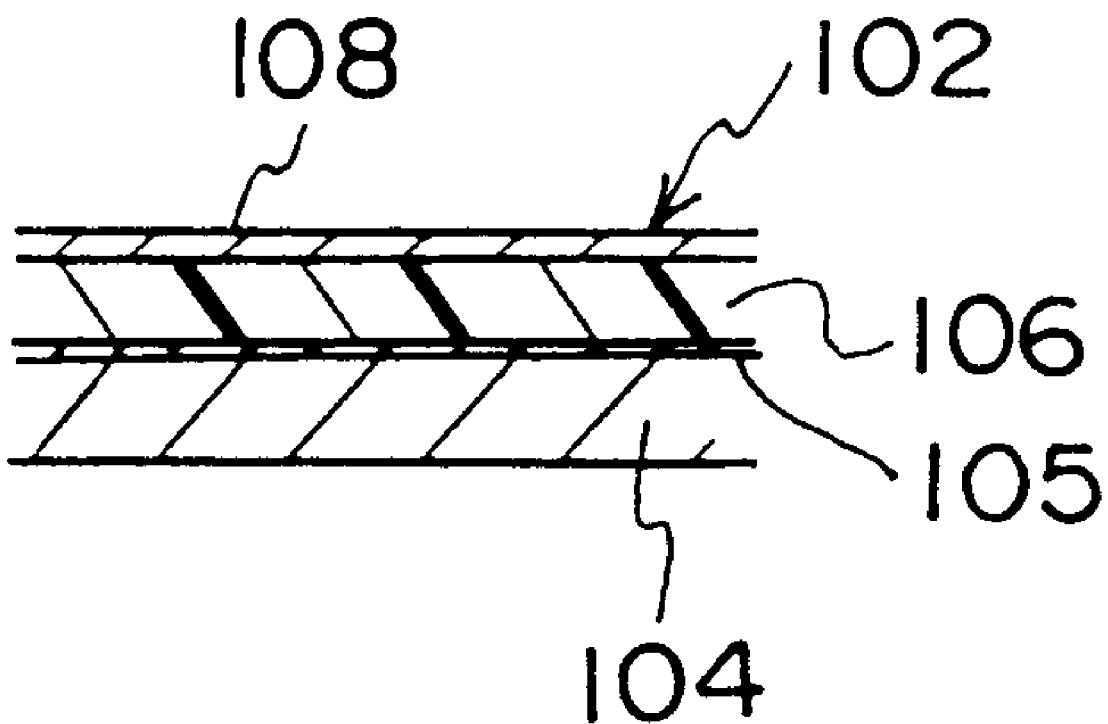
FIG. 2 is a sectional view of a photosensitive planographic printing plate used in each embodiment of the present invention.

As shown in FIG. 2, a photopolymer plate 102, which is one of photosensitive planographic printing plates, has, a photo-adhesive layer 105 and a photo-polymerizable layer 106 provided on an aluminum plate 104 which is a supporting layer. An overcoat layer 108 is laminated to the photo-polymerizable layer 106. That is, the photopolymer plate 102 is exposed to laser light in a state in which it has a four-layer structure, in order to form images. The exposure for forming images according to the present embodiment is performed by a setter which scans laser light and writes images on the basis of digital image data. This causes the promotion of the polymerization reaction in image portions of the photo-polymerizable layer.

After the end of the above-mentioned exposure, the photopolymer plate 102 is forwarded to a preheating section 110 that is positioned at the left end in FIG. 1.

In the preheating section 110, two pairs of conveying rollers 112 and 114 are provided to convey the photopolymer plate 102 while keeping the plate 102 horizontal. A heater unit 116 is provided therebetween. A guide plate 118 is provided opposite the heater unit 116 and under a conveying path of the photopolymer 102. The distance between a heater surface of the heater unit 116 and the photopolymer plate 102 is kept constant.

In the photopolymer plate 102, the degree of polymerization of exposed portions in the photo-polymerizable layer 106 is increased due to heat from the heater unit 116, and plate-wear necessary for printing is thereby improved.

A pre-water-washing section 120 is provided at the downstream side of the preheating section 110. The photopolymer plate 102 is conveyed horizontally into the section 110 after the preheating is completed.

Two pairs of conveying rollers 122 and 124 for conveying the photopolymer plate 102 are provided in the pre-water-washing 120 so that the plate 102 is conveyed horizontally. A brush roller 126 is provided above the conveying path which is between the transporting rollers. A spray pipe 128 is set at the slightly more upstream from the brush roller 126 to spray out water in the direction of the conveying path. When the photopolymer plate 102 is conveyed while water is being sprayed out from the spray pipe 128 and the brush roller 126 is being rotated (in the counterclockwise direction in FIG. 1), the overcoat layer 108, which is the topmost layer of the photopolymer plate 102, becomes moist and is removed by a brush roller 116.

That is, the photopolymer plate 102 is conveyed, in a state in which the overcoat layer 108 has been removed, to a developing section 130 for the next step.

In the developing section 130, a storage tank 132 in which a developer is collected is provided. The photopolymer plate 102 is immersed in this developer, so that unexposed portions of the photo-polymerizable layer 106 become moist. As a result, the unexposed portions are swelled and then removed.

Two pairs of conveying rollers 134 and 136 are provided near an insertion-inlet and outlet for photosensitive planographic printing plate of the developing section 130, respectively. The pair of the conveying rollers 134 has a function of guiding the photopolymer plate 102 to the storage tank 132, and the pair of the conveying rollers 136 has a function of guiding the photopolymer plate 102 to a rinse section 138 for the next step.

The storage tank 132 is provided with a guide plate 140, and the photopolymer plate 102 is guided by this guide plate 140 and is conveyed such that the path forms a large arc. In this storage tank 132, a brush roller 142 is provided above the conveying path. A pair of support rollers 144 and 146 is provided opposite the brush roller 142 and under the conveying path. The photopolymer plate 102 is conveyed while being nipped between the brush roller 142 and the support rollers 144 and 146. The brush roller 142 is thereby applied to the photo-polymerizable layer 106 of the photopolymer plate 102 at a given pressure, so that unexposed portions of the photo-polymerizable layer 106 are removed by rotation of the brush roller 142. Also, removal of the unnecessary unexposed portions near the boundaries between exposed portions and unexposed portions is ensured by brushing with the brush roller 142.

In the rinse section 138, two pairs of conveying rollers 148 and 150 for conveying the photopolymer plate 102 while keeping the plate 102 horizontal are provided. Spray pipes 152 and 154 are provided above and below the conveying path which is between the pair of the transporting rollers. Rinsing water is sprayed out from the spray pipes 152 and 154.

When the photopolymer plate 102 is sent out from the developing section 130 and reaches the rinse section 138, water is sprayed out from the spray pipes 152 and 154 to wash the front and back surfaces of the photosensitive planographic printing plate 102. The washed photopolymer plate 102 is conveyed to a finisher section 156 for the next step.

In the finisher section 156, two pairs 158 and 160 of conveying rollers for conveying the photopolymer plate 102 horizontally are provided. A spray pipe 162 is provided over the conveying path which is between the conveying rollers. A finisher solution (desensitizing solution) is sprayed out from the spray pipe 162.

The finisher solution is sprayed out from the spray pipe 162 while the photopolymer plate 102 is held horizontally as it is conveyed to the finisher section 156. In this way, the image formation surface is coated.

The above is a process for processing the photopolymer plate 102. The photopolymer plate 102 that has been subjected to this process is dried in a non-illustrated drying section to complete all processings.

In the present automatic-processing apparatus 100, brush rollers 126 and 142 are used as brush members particular to the present invention. The following will describe detailed structures of these brush rollers 126 and 142, with reference to FIG. 3. The brush roller 142 used in the developing section 130 is basic to this invention. Thus, this brush roller 142 for the developing tank 132 will be described as an example.

Figure 3:
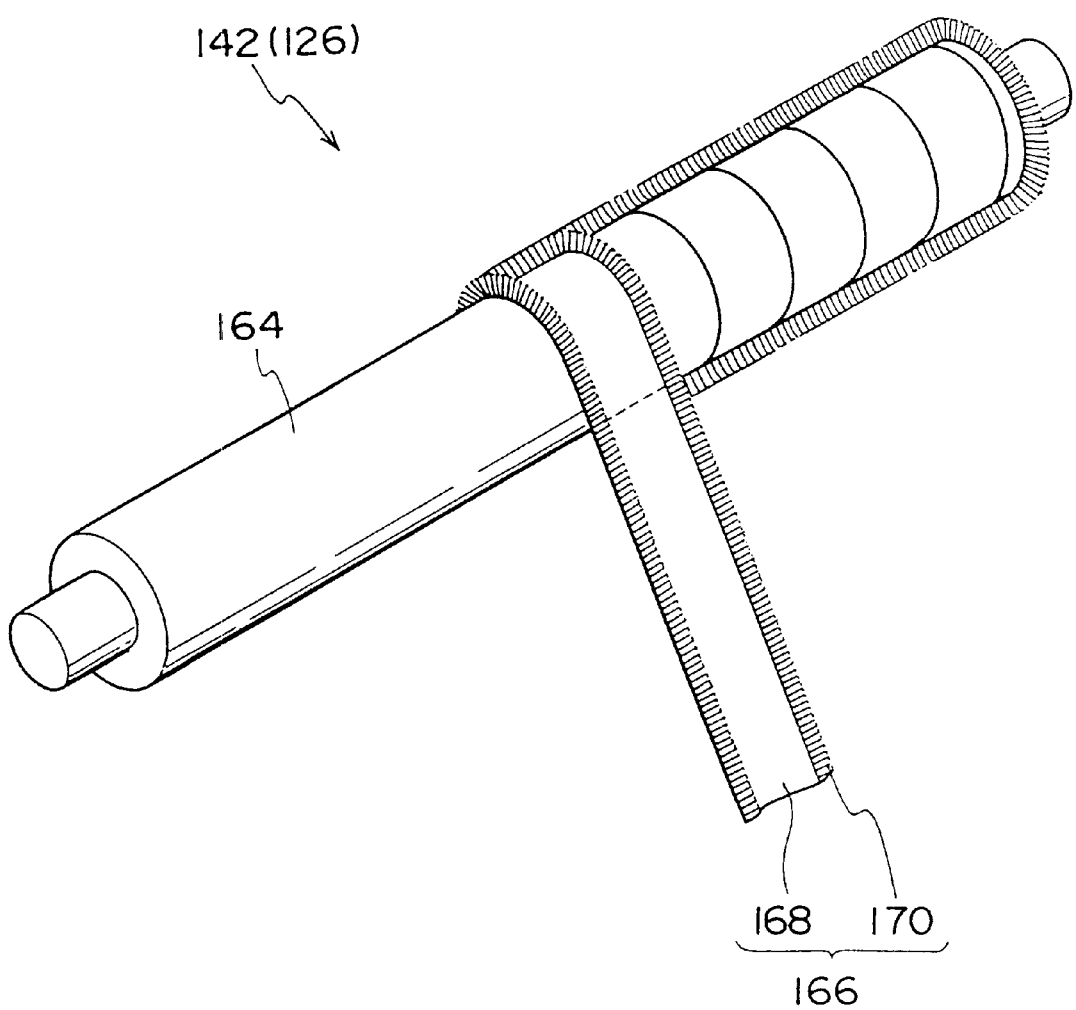
FIG. 3 is a perspective view of a closely-wound brush roller in a first embodiment of the present invention.

As shown in FIG. 3, the brush roller 142 is composed of a roller 164 as a core member, and a slender band 166 for brushing that is wound onto the peripheral surface of the roller 164 (hereinafter referred to as the band 166).

In the present embodiment, the brush roller 142 is formed such that its diameter is 25 to 50 mm. Preferably, the brush roller 142 is formed such that its diameter is 30 to 40 mm.

Figure 4:
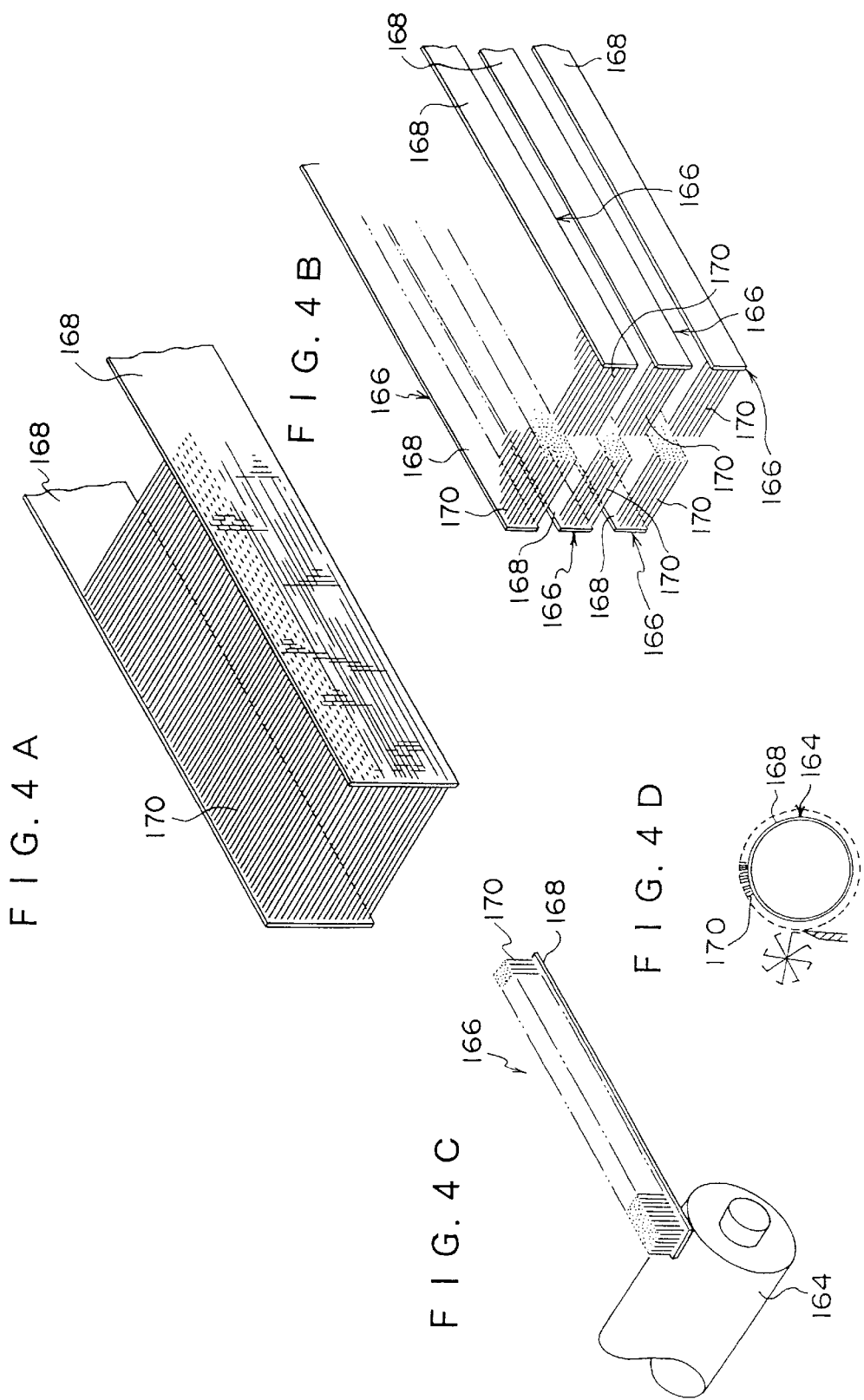
FIG. 4A is a diagram showing the step of producing a band used in each embodiment of the present invention.
FIG. 4B is a diagram showing the step of producing the band used in each embodiment of the present invention.
FIG. 4C is a diagram showing the step of producing the band used in each embodiment of the present invention.

As shown in FIG. 4A, the band 166 is formed by holding knitted fabric 168, which is a substrate in the form of two sheets, in such a manner that the sheets are opposed to each other and weaving bristles 170 into the knitted fabrics 168 in such a manner that the bristles 170 extend from one sheet of the knitted fabric 168 to the other. As the bristles 170, piles of natural fiber or synthetic fiber are suitably used in the present embodiment. The bristles 170 may also be made of a metal if the metal has an appropriate fineness. The knitted fabric 168 is not limited to natural fiber or synthetic fiber, but may be made of fine metal.

Materials from which the bristles 170 can be made are classified and listed as follows.
(1) Natural Fibers
  Vegetable fiber and animal fiber.
(2) Synthetic Fiber
  Polyamide fibers such as nylon 6, nylon 66, nylon 6,10 and nylon 11;
  polyester fibers such as polyethylene terephthalate and polybutylene terephthalate;
  polyacrylic fibers such as polyacrylonitrile and alkyl polyacrylate;
  polypropylene;
  polystyrene; and the like.
(3) Metallic Fibers
  Stainless steel;
  brass, and the like.

The bristles 170 are woven, in a strained state, into the knitted fabrics 168, and subsequently bristles 170 are cut in the middle portion, so as to complete formation of a band 166 (see FIG. 4B) used in the present embodiment. This band 166 is spirally wound onto the peripheral surface of the roller 164 (see FIG. 4C), and subsequently the band 166 is subjected to shearing to make the length of the bristles uniform (see FIG. 4D). In this way, the formation of a brush roller is completed.

The specification of the band 166 in this case is as shown in Table 1.

The density of the spirals when the band is wound in the spiral form is such that portions of the band 166 that come in contact with each other are close. That is, the band is wound such that the density of the spirals is high (close winding shown in FIG. 3).

Such close winding allows the bristles 170 to be uniformly planted, at a fixed density, throughout the whole peripheral surface of the roller 164.

Examples of the manner in which the band 166 may be wound around the roller 164 include winding three laterally-arranged bands 166 closely on the roller (three-stripe winding) as shown in FIG. 5, and winding a single band 166 at intervals of a fixed pitch (pitch winding) as shown FIG. 6. In the same manner as above, in these cases the bristles 170 are further cut so as to adjust the lengths thereof to be uniform. In this way, the brush roller 142 is made.

In the case that the bristles are made of natural fiber or synthetic fiber, in order to give the bristles appropriate rigidity, the specific values desirable are as follows: the thickness (D) of the bristles=1–10000 deniers per bristle, the length of the bristles=1–35 mm, and the density (P) of the bristles formed as the band for brushing=1000–225,000 (preferably 45,000–200,000) deniers/cm$^2$ (P=D×the number of the bristles per unit area (the number/cm$^2$)).

In this case, it is desirable that the relationship between the bristle thickness (denier per bristle) and the length L(mm) of the bristle desirably satisfies $1 \leq L \leq 7.5 \times (\log D + (2/3))$ In the case that the bristles are made of metallic fiber, it is desirable that the wire diameter (R) of the bristles =10–200 μm per bristle, the length of the bristles=1–30 mm, and the density (P) of the bristles formed as the band for brushing=0.05–7.0 mm$^2$/cm$^2$ (P=cross sectional area per bristle (mm$^2$ per bristle)×the number of the bristles per unit area (the number/cm$^2$)).

In this case, it is desirable that the relationship between the wire diameter R(μm per bristle) and the length L(mm) of the bristle satisfies $1 \leq L \leq 0.1R+10$.

Figure 7:
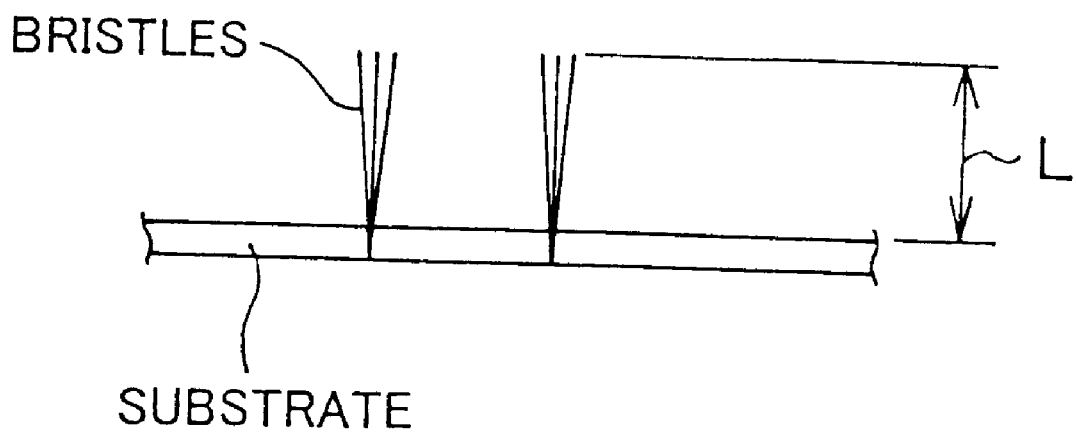
FIG. 7 is a sectional view of a brush member for defining the length L of bristles.

The length L of any bristle is the length projected out from the surface of the substrate, as shown in FIG. 7.

The following will summarize the above-mentioned numerical limitations and describe the bases for the limitations.

(1) Length of the Bristles

Natural or synthetic fiber: $1 \leq L \leq 7.5 \times (\log D + (2/3))$

Metallic fiber: $1 \leq L \leq 1.0R+10$

If L is lower than 1, the period when the bristles are usable becomes short and the bristles cannot withstand use (little frictional wear renders the bristles incapable of use).

If L exceeds the value of the right side of the inequality, the firmness of the bristles is reduced so that rubbing effect is lost.

(2) Thickness of the Bristles

Natural or synthetic fiber: 1–10,000 deniers per bristle

Diameter of the bristles

Metallic fiber: 10–200 μm per bristle

Figure 8:
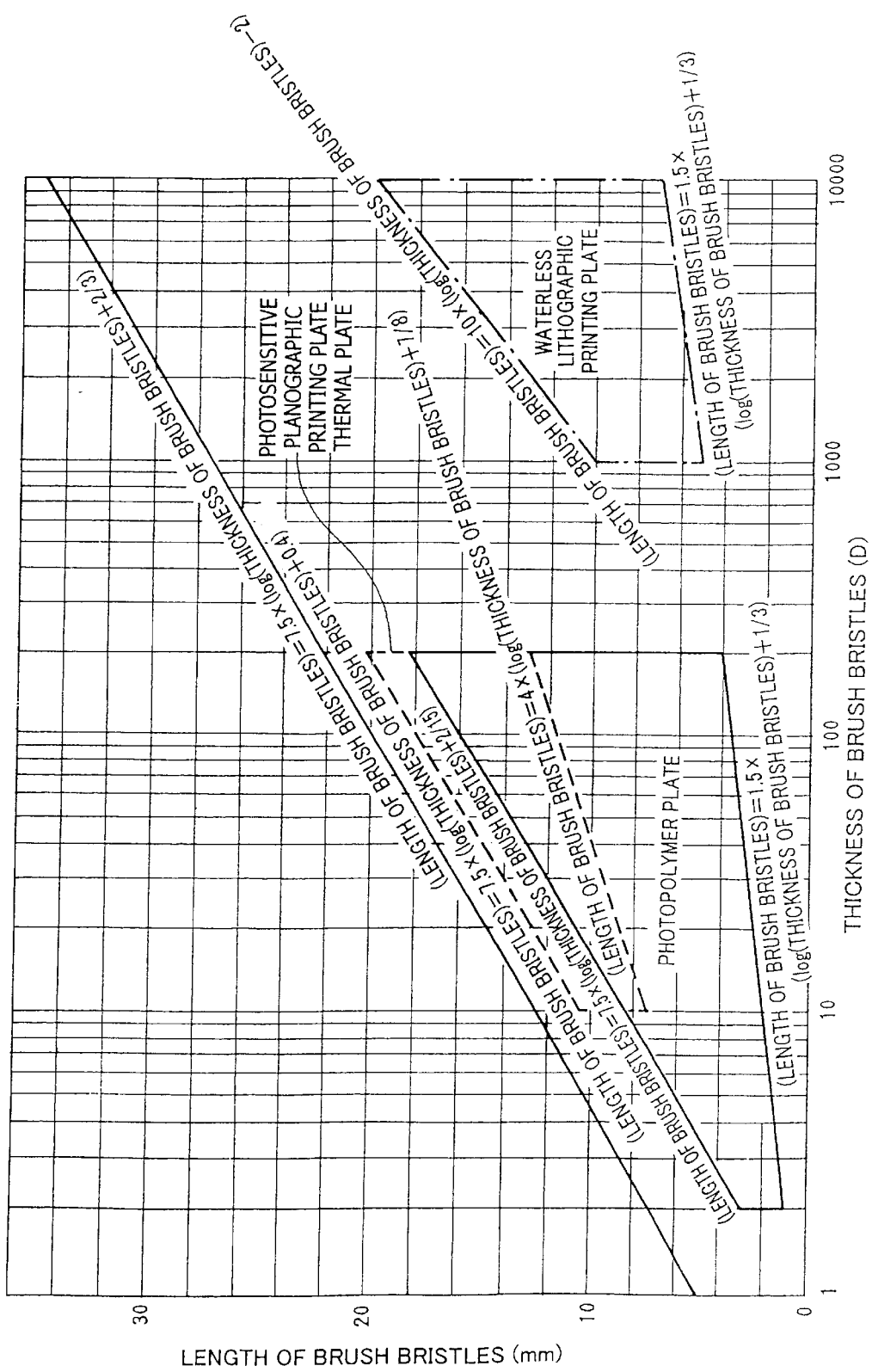
FIG. 8 is a graph of appropriate degrees for the relationship between thickness of bristles and length thereof for various printing plates.

As shown in FIG. 8, if the thickness is less than each of the lower limits, the bristle material will be non-existent, and if the thickness exceeds each of the above upper limits, the quality of finished images becomes poor.

It should be noted that, in FIG. 8, "Photosensitive planographic printing plate" represents a photosensitive planographic printing plate of a type which is commonly used in practice.

(3) Density of the Bristles

Natural or synthetic fiber: 1000–225,000 (preferably 45,000–200,000) deniers/cm$^2$ Metallic fiber: 0.05–7.0 mm$^2$/cm$^2$ If the density is less than each of the lower limits, rubbing effect cannot be obtained. It is difficult to attain a density that exceeds each of the above upper limits in the light of production process.

If attention is paid mainly to rubbing, it is advantageous for the density to be high. However, it is also necessary to consider the stirring effect. Therefore, it is necessary to lower the density, giving consideration to the balance between the stirring effect and the rubbing effect.

The following will describe the effect of the present embodiment.

After the end of exposure of the photosensitive planographic printing plate (for example, a photopolymer plate) 102 to laser light, the photosensitive planographic printing plate 102 comes to the preheating section 110 and then receives heat from the heater surface of the heater unit 116 while the photosensitive planographic printing plate 102 is conveyed by both pairs of conveying rollers 112 and 114. At this time, because the distance between the heater surface and the photopolymer plate 102 is kept constant, to attain uniform heating is attained.

In the photopolymer plate 102, the degree of polymerization of exposed portions of the photo-polymerizable layer 106 increases due to heat from the heater unit 116.

After the end of the preheating, the photopolymer plate 102 is forwarded to the pre-water-washing section 120.

In the pre-water-washing section 120, the photopolymer plate 102 is conveyed by both pairs of the conveying rollers 122 and 124 while water is being sprayed out from the spray pipe 128 and the brush roller 126 is being rotated (in the counterclockwise direction in FIG. 1) In this way, the overcoat layer 108, which is the top-most layer of the photopolymer plate 102, becomes moist and is removed by the brush roller 116.

The photopolymer plate 102 from which the overcoat layer 108 has been removed comes to the developing section 130. The photopolymer plate 102 is conveyed by the pair of conveying rollers 134 and then immersed into the storage tank 132. In the storage tank 132, the conveying of the photopolymer plate 102 is guided by the guide plate 140 so that the plate 102 is conveyed such that the path forms a large arc. Further, in the storage tank 132, the photopolymer plate 102 is conveyed while being nipped between the brush roller 142 and the support rollers 144 and 146. This allows the brush roller 142 to be applied at a set pressure to the photo-polymerizable layer 106 of the photopolymer plate 102, and the unexposed portions of the photo-polymerizable layer 106 are removed by rotation of the brush roller 142. The removal of the area at the boundaries between the exposed portions and the unexposed portions is ensured by the brushing operation of the brush roller 142. Thereafter, the photopolymer plate 102 is forwarded to the rinse section 138 by the pair of conveying rollers 136.

In the rinse section 138, the photopolymer plate 102 is horizontally conveyed by the two pairs of conveying rollers 148 and 150 while the front and back surfaces of the plate 102 are being washed with water sprayed out from the spray pipes 152 and 154. The washed photopolymer plate 102 is forwarded to the finisher section 156 the next step.

In the finisher section 156, the photopolymer plate 102 is horizontally conveyed by both pairs of the conveying roller 158 and 160 to coat the image formation surface of the plate 102 with a finisher solution sprayed out from the spray pipe 162. Thereafter, the photopolymer plate 102 is forwarded to the drying section.

In the present embodiment, the brush rollers 126 and 142 used in the pre-water-washing section 120 and the developing section 130 have a structure different from that of the channel brush roller or molton roller in the prior art.

That is, the band 166 is wound around the peripheral surface of the roller 164 which is a core member. This band 166 is a sheet-form knitted fabric 168 into which the bristles (pile) 170 are woven.

By weaving the bristles 170 into the knitted fabric 168, the bristles 170 can be formed at a uniform pitch of a μm-units. Thus, it is possible to overcome the poor removal of the unnecessary portions of the photo-polymerizable layer, which is caused by density-unevenness of the bristles in the channel brush.

Since the bristles 170 are provided at a high density, the rigidity of the bristles 170 can be made high. Even in the case of the photo-polymer plate where in order to remove unnecessary portions of the photo-polymerizable layer (a photosensitive layer), it is necessary to rub the layer more intensely (with higher pressure) than in other photosensitive planographic printing plates, the ends of the bristles 170 do not lie down, so that display of the brushing function is ensured.

Examples of the ways in which the band 166 can be wound onto the roller 164 include close winding (see FIG. 3), three-stripe winding (see FIG. 5), and pitch winding (see FIG. 6).

As described above, in the present embodiment, the brushes 126 and 142 used in the pre-water-washing section 120 and the developing section 130 are structured by winding the slender band 166, wherein the bristles 170 are woven into the sheet-form knitted fabric 168, on the peripheral surface of the roller 164 which is a core member. It is therefore possible to densely and uniformly arrange the bristles 170 throughout the whole of the peripheral surface accurate to the μm. Thus, the brush rollers can be applied to the photopolymer plate 102 which uses the photo-polymerizable layer 106 as a photosensitive layer and for which strong rubbing is necessary. Further, brushing unevenness which makes it impossible to remove unnecessary portions of the photo-polymerizable layer 106 is not generated.

The automatic-processing apparatuses the present embodiment and other embodiments which will be described later can be applied to not only the photopolymer plate 102 but also to other photosensitive planographic printing plates, such as a thermal plate, a waterless planographic printing plate, and a photosensitive planographic printing plate currently in use. Moreover, they can be applied to not only a photosensitive planographic printing plate but also other photosensitive materials such as an X-ray film, an ordinary monochrome film, a color film, a monochrome printing paper and a color printing paper.

The brush members according to the present embodiment and each of the embodiments which will be described later can be used in not only the pre-water-washing section 120 and the developing section 130 but also other processing sections such as the rinse section 138.

The brush members according to the present embodiment and the embodiments which will be described later can be used in not only the method wherein a photosensitive planographic printing plate is immersed in a developer in a storage tank in a developing section but also the method wherein a developer is sprayed from a spraying member onto a photosensitive planographic printing plate which is horizontally conveyed in a developing section and subsequently the photosensitive planographic printing plate is brushed by means of a brush roller.

The definitions and types of the above-mentioned photosensitive planographic printing plate will be described hereinafter although they are known.

(1) A Photosensitive Planographic Printing Plate Currently in Use

A photosensitive planographic printing plate currently in use has a structure in which a photosensitive composition is applied in a thin layer form onto an aluminum plate, and this planographic photosensitive printing plate is subjected to image-exposure and then is developed to obtain a planographic printing plate. The aluminum plate is usually subjected to surface-roughening treatment based on a mechanical process such as brush grain process or ball grain process, an electrochemical process such as electrolytic grain process, or any combination thereof, so as to make its surface rough. Thereafter, the aluminum plate is etched with, an acidic, alkaline solution or other, is subjected to anodic oxidation and is, if desired, subjected to hydrophilization treatment to produce a support for a planographic printing plate. A photosensitive layer is deposited on this support to produce a photosensitive planographic printing plate.

This photosensitive planographic printing plate is usually subjected to image-exposure, developing, water-washing, and gum coating steps to produce a planographic printing plate. This is installed into a printing apparatus to perform printing.

The photosensitive planographic printing plate used in the production of the planographic printing plate is classified into a positive type photosensitive planographic printing plate and a negative type photosensitive planographic printing plate. For positive photosensitive compositions of the positive type photosensitive planographic printing plate, for example, O-quinonediazido compound is widely used. Such a photosensitive compound is applied alone onto a support, or is mixed with an alkali-soluble resin such as Novolack type phenol resin or cresol resin and is then applied to a support. If a support having a hydrophilic surface is used, the O-quinonediazido compound is decomposed at exposed portions so that the portions become alkali-soluble. Therefore, the portions are easily removed with an alkali developer so that the hydrophilic surface of the support is exposed. This surface accepts water and repels ink. On the other hand, unexposed light portions remaining as images are lipophilic and accept ink.

For negative photosensitive compositions of the negative photosensitive planographic printing plate, a diazonium salt, an azido compound or a photo-polymerizable compound, for example, is used in many cases. Such a compound is applied alone onto a support, or is mixed with an appropriate additive such as a resin and then is applied onto a support. If a support having a hydrophilic surface is used, unexposed portions are removed with a developer so that the hydrophilic surface of the support is exposed. This surface accepts water and repels ink.

On the other hand, portions that are made hard by light-exposure and remain as images upon development are lipophilic and receive ink.

(2) Waterless Planographic Printing Plate

The waterless planographic printing plate has, for example, a structure in which a primer layer, a photosensitive layer and a silicone rubber layer are, in this order, deposited on a support. As the support, there is used an aluminum plate, which is dimensionally stable. The primer layer comprises, for example, an unsaturated monomer or an oligomer thereof as a film-hardening agent, a light polymerization initiator, a polymer or an inorganic powder as a filler for keeping the shape of the photosensitive layer, and an optional thermal polymerization inhibitor.

The compound of the silicone rubber layer can be represented, for example, by the following chemical formula:

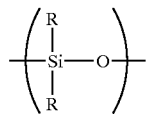

The silicone rubber layer is composed mainly of a linear organic polysiloxane having the units above repeated and having a molecular weight of several thousands to several hundred thousands. In the above formula, R is an alkyl group having 1–10 carbon atoms or a phenyl group. Preferably, 60% or more of R groups is methyl. In general, such a linear organic polysiloxane is made into a crosslinked silicone rubber by adding a reactive crosslinking agent thereto.

(3) Thermal Plate
  (i) Positive Type

The positive type thermal plate has, for example, a structure wherein an undercoat layer and a photosensitive layer are deposited on a support. For example, the light energy of laser light applied to the positive type thermal plate is converted to thermal energy so that the aggregation state of a binder in the photosensitive layer changes. As a result, the photosensitive layer becomes into alkali-soluble. This portion is removed by development, so as to be made into a non-image portion.

(ii) Negative Type

The negative type thermal plate has, for example, a structure wherein a closely adhering layer and a photosensitive layer are deposited on a support. For example, the light energy of laser light applied to the negative type thermal plate is converted to thermal energy so that an acid-generating agent in the photosensitive layer generates an acid. Thereafter, preheating, with this acid as a catalyst causes promotion of a thermal crosslinking reaction and thus, exposed portions of the photosensitive are hardened so as to be made into image portions. Non-image portions of the photosensitive layer are dissolved and removed as a result of development.

TABLE 1

| | |
|---|---|
| Material of bristles | Natural fiber, and synthetic fiber |
| Specifications of Thickness of the bristles | 1–10000 deniers per bristle (=D) |
| | Preferable Specifications for each type of plate |
| (Photosensitive planographic printing plate) | $10 \leq D \leq 200$ |
| (Thermal plate) | $10 \leq D \leq 200$ |
| (Waterless planographic printing plate) | $1000 \leq D \leq 10000$ |
| (Photopolymer plate) | $2 \leq D \leq 200$ |
| Specifications of Length of the bristles | 1–35 mm |
| | Preferable Specifications for each type of plate |
| (Photosensitive planographic printing plate) | 7.5–20.2 |
| (Thermal plate) | 7.5–20.2 |
| (Waterless planographic printing plate) | 5.0–20.0 |
| (Photopolymer plate) | 1.0–18.4 |
| Specifications of Density of the bristles | 1000–225000 deniers/cm$^2$ |
| | Preferable Specifications for each type of plate |
| (Photosensitive planographic printing plate) | 4000–20000 deniers per bristle |
| (Thermal plate) | 4000–20000 deniers per bristle |
| (Waterless planographic printing plate) | 50000–150000 deniers per bristle |
| (Photopolymer plate) | 50000–150000 deniers per bristle |
| | L: Length (mm) of the bristles, D: Thickness of the bristles (deniers per bristle), log: Common logarithms |
| Specifications of Relationship between the length of the bristles and the thickness thereof | $1 \leq L \leq 7.5 \times (\log D + (2/3))$ |
| | Preferable Specifications for each type of plate |
| (Photosensitive planographic printing plate) | $4 \times (\log D + (7/8)) \leq L \leq 7.5 \times (\log D + (2/5))$ |
| (Thermal plate) | $4 \times (\log D + (7/8)) \leq L \leq 7.5 \times (\log D + (2/5))$ |
| (Waterless planographic printing plate) | $1.5 \times (\log D + (1/3)) \leq L \leq 10 \times (\log D - 2)$ |
| (Photopolymer plate) | $1.5 \times (\log D + (1/3)) \leq L \leq 7.5 \times (\log D + (4/30))$ |
| Material of bristles | Metallic fiber |
| Specifications of Thickness of the bristles | 10–200 μm per bristle (=R) |
| | Preferable Specifications for each type of plate |
| (Photosensitive planographic printing plate) | ************* |
| (Thermal plate) | ************* |
| (Waterless planographic printing plate) | ************* |
| (Photopolymer plate) | ************* |
| Specifications of Length of the bristles | 1–30 mm |
| Specifications of Density of the bristles | 0.05–7.0 mm$^2$/cm$^2$ |
| | Preferable Specifications for each type of plate |
| (Photosensitive planographic printing plate) | 0.1–0.5 mm$^2$/cm$^2$ |
| (Thermal plate) | 0.1–0.5 mm$^2$/cm$^2$ |

TABLE 1-continued

| | |
|---|---|
| (Waterless planographic printing plate) | 1.0–5.0 mm²/cm² |
| (Photopolymer plate) | 1.0–5.0 mm²/cm² |
| Specifications of Relationship between the length of the bristles and the thickness thereof | $1 \leq L \leq 0.1R + 10$ |
| Preferable Specifications for each type of plate | |
| (Photosensitive planographic printing plate) | ************** |
| (Thermal plate) | ************** |
| (Waterless planographic printing plate) | ************** |
| (Photopolymer plate) | ************** |
| | L: Length (mm) of the bristles, R: Wire diameter (μm) of the bristles |

Note: "(Photosensitive planographic printing plate)" above represents a photosensitive planographic printing plate of a type which is commonly used in practice.

In short, according to the photosensitive material automatic-processing apparatus based on the present embodiment, an ordinary metal roller can be applied, as a core member, to a photosensitive planographic printing plate, in particular a photopolymer plate using a photopolymerizable layer as a photosensitive layer. Therefore, planting density of bristles for brushing can be made uniform. This uniformity can overcome brushing unevenness.

In the first embodiment, when the fabric planted with bristles which is in a band form is wound spirally onto the roller, it is necessary for an adhesive agent to be applied to the back surface (i.e., the surface to which no bristles are planted) of the bristle-planted fabric. That is, the bristle-planted fabric is fixed to the roller with the adhesive agent.

The following will describe, as a second embodiment, a photosensitive material processing apparatus which makes it possible without the use of an adhesive agent, for the fabric to be kept stable and the wound band not become loose, when the fabric which is planted with bristles is fixed to the body of the brush.

In the present embodiment, only points different from the first embodiment will be described, and detailed explanation of the same elements and effects thereof as in the first embodiment is omitted.

Figure 9:
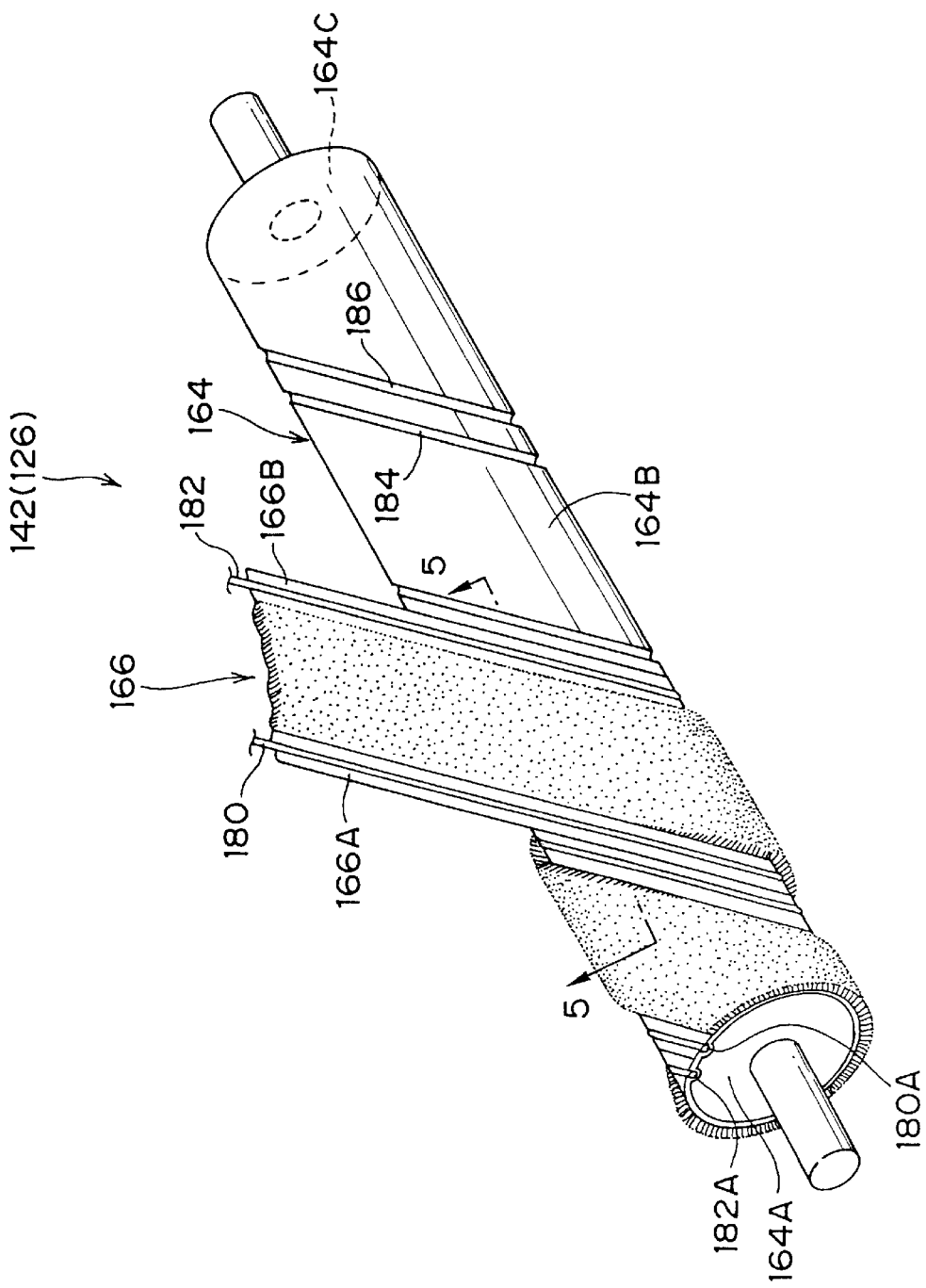
FIG. 9 is a perspective view of a brush roller according to a second embodiment of the present invention.

As shown in FIG. 9, wires 180 and 182 made of a metal, as fixing members, are wound onto both end portions 166A and 166B of a band 166 spirally wound onto the outer peripheral portion of a roller 164. Each of both end portions 180A and 182A of the wires 180 and 182 is welded onto an end surface 164A of the roller 164.

Figure 10:
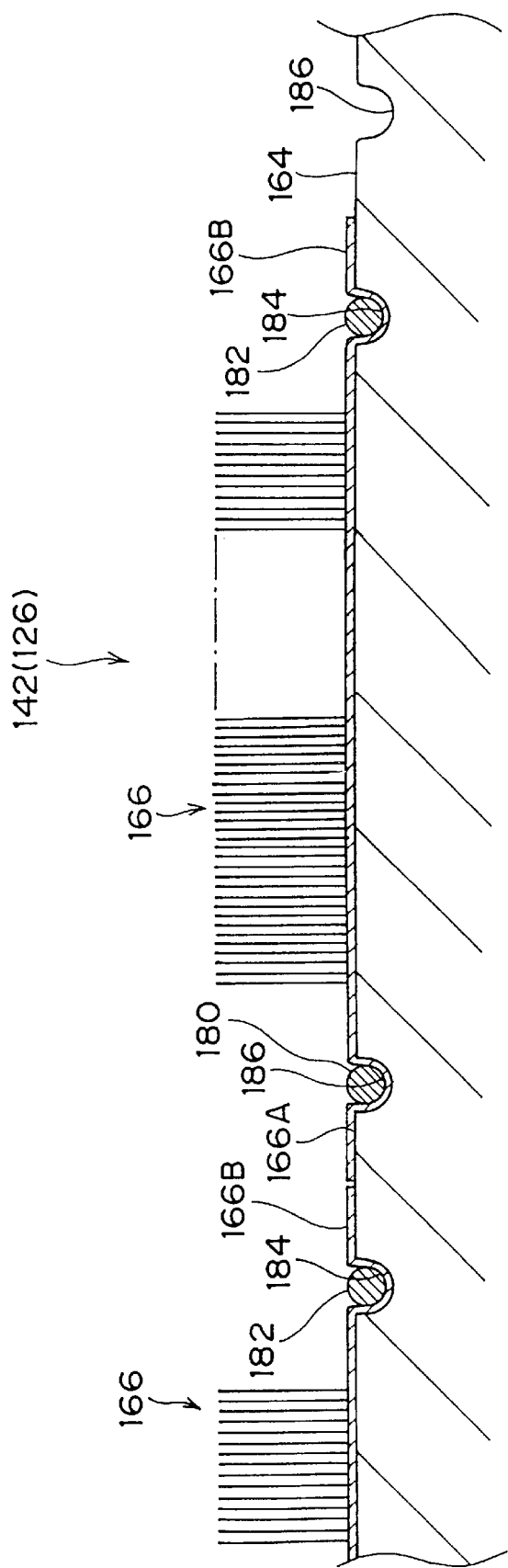
FIG. 10 is an enlarged sectional view taken on line 5—5 of FIG. 9.

Two grooves 184 and 186 are spirally formed in the outer peripheral portion 164B of the roller 164. As shown in FIG. 10, both the end portions 166A and 166B of the band 166 and the wires 180 and 182 are accommodated in these grooves 184 and 186, thereby fixing the band 166 onto the outer peripheral portion 164B of the roller 164. The manner of winding the band 166 onto the roller 164 could be by winding the single band 166 at intervals of a fixed pitch (pitch winding). Thereafter, in the same way as above, bristles 170 are subjected to shearing, id in order to make the length thereof uniform. In this way, a brush roller 142 is completed.

The effect of the present embodiment is basically the same as that of the first embodiment. In the present embodiment, however, the bands 166 are not adhered to the brush rollers 126 and 142 used in the pre-water-washing section 120 and the developing section 130 with an adhesive agent. Therefore, the problem that an adhesive agent permeates the bristles 170 from the end portion of the band 166 and solidifies causing the bristles 170 to lose flexibility and a problem that an adhesive agent becomes dissolved in a developer during development do not arise.

The following will describe an assembly process of the brush rollers 126 and 142 in the present embodiment using the brush roller 142 as an example.

First, one end portion of the band 166 is set to one end portion of the outer peripheral portion 164B of the roller 164, and subsequently the band 166 is spirally wound onto the outer peripheral portion 164B of the roller 164. At the same time, the wires 180 and 182, each one end portion 180A and 182A of which is welded onto the end surface 164A of the roller 164, are wound onto the both end portions 166A and 166B, which have no bristles 170, of the band 166. These are accommodated in the grooves 184 and 186. Finally, the other end portions of the wires 180 and 182 are welded onto the end surface 164C of the roller 164.

In this way, the band 166 is kept wound onto the roller 164 an adhesive agent being applied to the back surface of the band 166. Thus, it is possible to avoid the solidification of the bristles 170 by an adhesive agent and dissolution of an adhesive agent into a developer. Also, since no adhesive agent is used, performing the application of an adhesive agent becomes unnecessary and low-cost brush rollers 126 and 142 can be produced.

Figure 11:
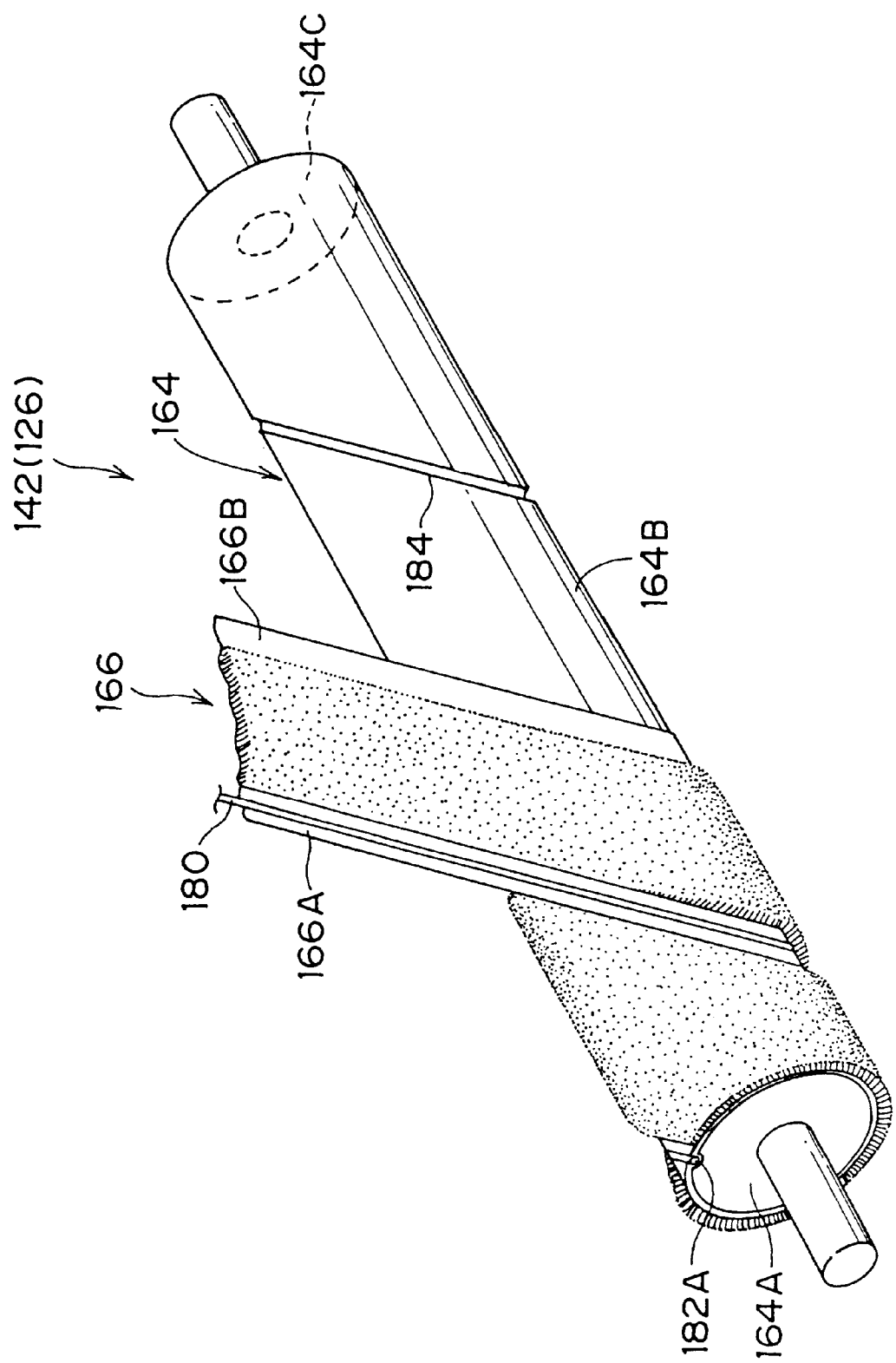
FIG. 11 is a perspective view of a brush roller according to a modification of the second embodiment of the present invention.
Figure 12A:
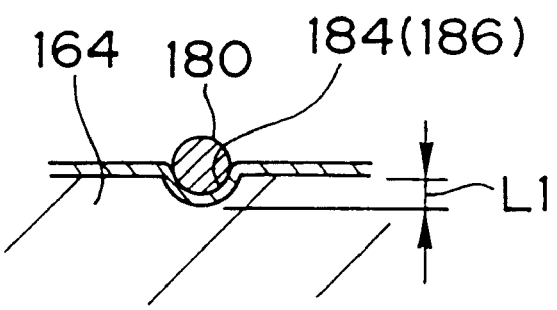
FIG. 12A is a sectional view of a groove of the brush roller according to the modification of the second embodiment of the present invention.
Figure 12B:
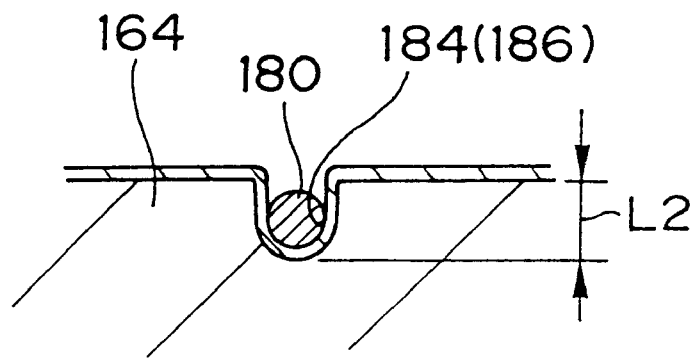
FIG. 12B is a sectional view according to another modification, which corresponds to FIG. 12A.

As shown in FIG. 11, the structure may be one in which a single groove 184 is spirally made in the outer peripheral portion 164B of the roller 164; both end portions 166A and 166B adjacent to each other, which have no bristles 170, of the band 166 are overlapped and wound; and both the end portions 166A and 166B, together with the wire 180, are accommodated in the groove 184. As shown in FIG. 12A, the depth of each of the grooves 184 and 186 may be of a depth L1 such that only one part of the wire 180 can be accommodated. As shown in FIG. 12B, the depth of each of the grooves 184 and 186 may be of a depth L2 such that the whole of the wire 180 can be accommodated. The material of the wires 180 and 182 is not limited to a metal, and wire of other material, for example, a resin may be used. The method of fixing the wires 180 and 182 to the roller 164 is not limited to welding of both the end portions, and a fixing method using a fixing means, such as bolts, by way of a bracket fixed to both the end portions may be used. A structure wherein the whole of the wires 180 and 182 is fitted into the grooves 184 and 186 formed in the roller 164 may also be used.

The example has been described wherein the bristles 170 are not planted into both the end portions 166A and 166B of the band 166, but the wire 180, or the wires 180 and 182 may be wound onto both the end portions 166A and 166B into which the bristles 170 are planted, so as to be accommodated in the groove 184, or the grooves 184 and 186. Also, the band 166 may be wound onto the roller 164 which does not have the grooves 184 and 186 for accommodating the wires 180 and 182 provided, and further the wires 180 and 182, the ends of which are fixed to the roller 164, may be wound onto both the end portions 166A and 166B into which the bristles 170 are not planted so as to fix the band to the roller 164. In this case, the band 166 wherein the bristles 170 are planted into both the end portions 166A and 166B may be used.

Figure 13:
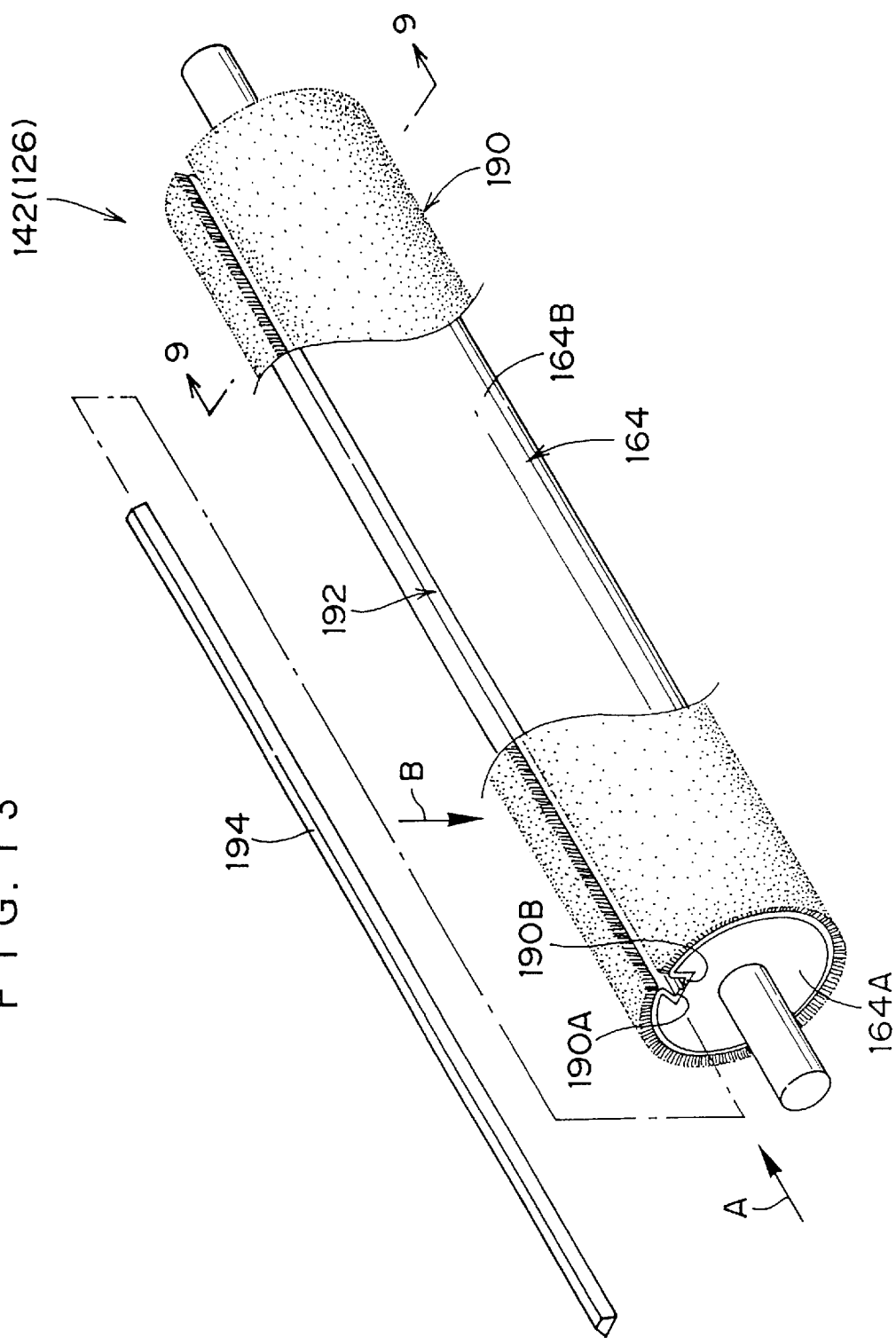
FIG. 13 is an exploded perspective view of a brush roller according to a third embodiment of the present invention.

The following will describe a third embodiment of the photosensitive material processing apparatus according to the present invention, referring to FIGS. 13 and 14.

The same reference numbers are attached to the same members as in the above-mentioned embodiments, and explanation thereof is omitted. Explanation of the effects of the same steps as in the above-mentioned embodiments is also omitted.

As shown in FIG. 13, in the present embodiment, a brush roller 142 is composed of a roller 164 as a core member, and a brushing band 190 which is wound onto the outer peripheral portion of the roller 164 and is a long thin strip configuration in the axial direction of the roller 164 (hereinafter referred to merely as the band 190).

As shown in FIG. 14, the band 190 is made in the same way as the band 166. A resin piece 194, as a fixing member, is disposed at both end portions 190A and 190B of the band 190 which is wound along the circumferential direction of the roller 164. The resin piece 194 is swelled with a developer. Bristles 170 may or may not be planted into both the end portions 190A and 190B.

A groove 192 along the axial direction of the roller 164 is linearly formed on the outer peripheral portion 164B of the roller 164. Both the end portions 190A and 190B of the band 190 and the resin piece 194 are fitted into the groove 192 and the band 190 is thus fixed to the outer peripheral portion 164B of the roller 164.

The sectional shape of the groove 192 and the resin piece 194 is trapezoid, and the resin piece 194 is inserted into the groove 192 from the axial direction of the roller 164 (the direction of an arrow A in FIG. 13).

In the present embodiment, therefore, in the same way as in the second embodiment, even if no adhesive agent is applied to the whole of the back surface of the band 190, it is possible to maintain the state in which the band 190 is wound onto the outer peripheral portion 164B of the roller 164. Thus, it is possible to avoid the solidification of the bristles 170 due to permeation by an adhesive agent, and dissolution of an adhesive agent in a developer. Moreover, as the resin piece 194 is swelled with the developer, it is possible to ensure that the band 190 is kept wound onto the outer peripheral portion 164B of the roller 164.

A metallic piece may be used instead of the resin piece 194 as the fixing member. Also, the shape of the cross section of the groove 192 and the resin piece 194 may be a shape other than a trapezoid. The resin piece 194 may be inserted into the groove 192 from the radial direction of the roller 164 (the direction of an arrow B in FIG. 13). Of both the end portions 190A and 190B of the band 190, only one end portion that is at the upstream side in the rotational direction of the roller, may be fixed by the resin piece 194 which serves as the fixing member, while the other end portion is left free.

In short, the photosensitive material developing apparatus in the present embodiment has an excellent effect that even if no adhesive agent is used at the time of fixing the brushing band onto the roller which is a core member of the brush roller, the winding of the band does not become loose and the band can be kept in the state wherein it is stably set onto the roller.

What is claimed is:

1. An apparatus for processing photosensitive material, in which the photosensitive material is brushed by a brush member for promoting image forming processing when it is transported through the apparatus, the brush member comprising:

(a) a roller adapted for mounting in the apparatus so as to be rotatable about an axis generally transverse to a direction in which the photosensitive material is transported when being processed in the apparatus, the roller having a peripheral surface; and (b) a brushing band having a substrate with bristles woven into the substrate, the brushing band being set into the peripheral surface of the roller, wherein the bristles comprise at least one material selected from the group consisting of natural fibers and artificial fibers, with each bristle having a thickness from 1 to 10,000 deniers, and a length from 1 to 35 mm, with the bristles arranged in the brushing band to have a density from 1000 to 225,000 deniers per square cm, where the density is defined as average number of bristles per unit area multiplied by average thickness of the bristles.

2. The apparatus for processing photosensitive material of claim 1, wherein the photosensitive material is a photopolymer plate.

3. The apparatus for processing photosensitive material of claim 1, wherein at least one brush member is provided in the apparatus.

4. The apparatus for processing photosensitive material of claim 3, wherein when two brush members are provided in the apparatus, thickness, length and density of the bristles which form the brushing band of each brush member are equal, respectively.

5. The apparatus for processing photosensitive material of claim 1, wherein the photosensitive material is brushed by the brush member under the presence of a developer.

6. The apparatus for processing photosensitive material of claim 3, wherein the diameter of the brush member is 25 to 50 mm, and preferably 30 to 40 mm.

7. The apparatus for processing photosensitive material of claim 1, wherein a relationship exists between an average length, L, of the bristles in mm and average thickness, D, of the bristles in deniers, with $1 \leq L \leq 7.5 \times [\log(D) + \frac{2}{3}]$.

8. An apparatus for processing photosensitive material, in which the photosensitive material is brushed by a brush member for promoting image forming processing when it is transported through the apparatus, the brush member comprising:

(a) a roller adapted for mounting in the apparatus so as to be rotatable about an axis generally transverse to a direction in which the photosensitive material is transported when being processed in the apparatus, the roller having a peripheral surface; and (b) a brushing band having a substrate with bristles woven into the substrate, the brushing band being set into the peripheral surface of the roller, wherein the bristles comprise a metallic fiber, each metallic fiber having a diameter from 10 to 200 $\mu$m and a length from 1 to 30 mm, with the bristles arranged in the brushing band to have a density from 0.05 to 7.0 $mm^2/cm^2$, where the density is defined as average number of bristles per $mm^2$ multiplied by average cross sectional area of the bristles in $mm^2$.

9. The apparatus for processing photosensitive material of claim 8, wherein a relationship exists between an average length, L of the fibers in mm and average diameter of the fibers, R, in μm, said relationship satisfies $1 \leq L \leq [(0.1R)+10]$.

10. The apparatus for processing photosensitive material of claim 8, wherein the photosensitive material is a photopolymer plate.

11. The apparatus for processing photosensitive material of claim 8, wherein at least one brush member is provided in the apparatus.

12. The apparatus for processing photosensitive material of claim 8, wherein the photosensitive material is brushed by the brush member under the presence of a developer.

13. An apparatus for processing photosensitive material, in which the photosensitive material is brushed by a brush member for promoting image forming processing when it is transported through the apparatus, the brush member comprising:

(a) a roller adapted for mounting in the apparatus so as to be rotatable about an axis generally transverse to a direction in which the photosensitive material is transported when being processed in the apparatus, the roller having a peripheral surface; and (b) a brushing band having a substrate with bristles woven into the substrate, the brushing band being set into the peripheral surface of the roller, wherein the roller includes a groove defined in the peripheral surface of the roller for at least partially accommodating the brushing band therein, and a fixing member for fixing the brushing band in the groove.

14. The apparatus for processing photosensitive material of claim 13, wherein the groove spirally extends along the peripheral surface of the roller.

15. The apparatus for processing photosensitive material of claim 13, wherein the groove extends substantially parallel to the rotational axis of the roller when the roller is rotatably mounted in the apparatus.

16. The apparatus for processing photosensitive material of claim 13, wherein the groove spirally extends and the fixing member comprises a metallic wire.

17. The apparatus for processing photosensitive material of claim 13, wherein the groove spirally extends and the fixing member comprises a resin piece.

18. The apparatus for processing photosensitive material of claim 13, wherein the groove spirally extends and the fixing member comprises a metallic piece.

19. The apparatus for processing photosensitive material of claim 13, wherein the bristles comprise at least one material selected from the group consisting of natural fibers and artificial fibers, with each bristle having a thickness from 1 to 10,000 deniers, and a length from 1 to 35 mm, with the bristles arranged in the brushing band to have a density from 1000 to 225,000 deniers per square cm, where the density is defined as average number of bristles per unit area multiplied by average thickness of the bristles.

20. The apparatus for processing photosensitive material of claim 13, wherein a relationship exists between an average length, L, of the bristles in mm and average thickness, D, of the bristles in deniers, with $1 \leq L \leq 7.5 \times [\log(D) + 2/3]$.

21. The apparatus for processing photosensitive material of claim 13, wherein the bristles comprise a metallic fiber, each metallic fiber having a diameter from 10 to 200 μm and a length from 1 to 30 mm, with the bristles arranged in the brushing band to have a density from 0.05 to 7.0 mm²/cm², where the density is defined as average number of bristles per cm² multiplied by average cross sectional area of a bristle in mm².

22. The apparatus for processing photosensitive material of claim 13, wherein a relationship exists between an average length, L, of the fibers in mm and average diameter, R, of the fibers in μm, said relationship satisfies $1 \leq L \leq [(0.1R)+10]$.

23. The apparatus for processing photosensitive material of claim 13, wherein the photosensitive material is a photopolymer plate.

24. The apparatus for processing photosensitive material of claim 13, wherein at least one brush member is provided in the apparatus.

25. The apparatus for processing photosensitive material of claim 13, wherein the photosensitive material is brushed by the brush member under the presence of a developer.

26. A brush for use in an apparatus for processing photosensitive material, the brush comprising:

(a) a substrate;

(b) bristles woven into the substrate, to thereby form a brushing band; and (c) a roller on which the brushing band is spirally wound around, to thereby form a brush;

wherein the bristles comprise at least one material selected from the group consisting of natural fibers and artificial fibers, with each bristle having a thickness from 1 to 10,000 deniers, and a length from 1 to 35 mm, with the bristles arranged in the brushing band to have a density from 1000 to 225,000 deniers per square cm, where the density is defined as the average number of bristles per unit area multiplied by average thickness of the bristles.

27. The apparatus for processing photosensitive material of claim 26, wherein a relationship exists between an average length, L, of the bristles in mm and average thickness, D, of the bristles in deniers, with $1 \leq L \leq 7.5 \times [\log(D) + 2/3]$.

28. The apparatus for processing photosensitive material of claim 26, wherein the bristles comprise a metallic fiber, each metallic fiber having a diameter from 10 to 200 μm and a length from 1 to 30 mm, with the bristles arranged in the brushing band to have a density from 0.05 to 7.0 mm²/cm², where the density is defined as average number of bristles per cm² multiplied by average cross sectional area of a bristle in mm².

29. The apparatus for processing photosensitive material of claim 26, wherein a relationship exists between an average length, L, of the fibers in mm and average diameter, R, of the fibers in μm, said relationship satisfies $1 \leq L \leq [(0.1R)+10]$.

* * * * *